(12) United States Patent
Ramachandran et al.

(10) Patent No.: US 9,536,900 B2
(45) Date of Patent: Jan. 3, 2017

(54) FORMING FINS OF DIFFERENT SEMICONDUCTOR MATERIALS ON THE SAME SUBSTRATE

(71) Applicant: GLOBALFOUNDRIES INC., Grand Cayman OT (KY)

(72) Inventors: Ravikumar Ramachandran, Pleasantville, NY (US); Huiling Shang, Yorktown Heights, NY (US); Keith Tabakman, Newburgh, NY (US); Henry K. Utomo, Newburgh, NY (US); Reinaldo A. Vega, Wappingers Falls, NY (US)

(73) Assignee: GLOBALFOUNDRIES INC., Grand Cayman OT (KY)

( * ) Notice: Subject to any disclaimer, the term of this patent is extended or adjusted under 35 U.S.C. 154(b) by 18 days.

(21) Appl. No.: 14/284,820

(22) Filed: May 22, 2014

(65) Prior Publication Data
US 2015/0340381 A1 Nov. 26, 2015

(51) Int. Cl.
*H01L 21/84* (2006.01)
*H01L 27/12* (2006.01)
*H01L 21/762* (2006.01)
*H01L 29/10* (2006.01)

(52) U.S. Cl.
CPC ......... *H01L 27/1211* (2013.01); *H01L 21/762* (2013.01); *H01L 21/76224* (2013.01); *H01L 21/845* (2013.01); *H01L 29/1054* (2013.01)

(58) Field of Classification Search
CPC ................. H01L 21/845; H01L 21/823807
USPC ........................................... 438/157
See application file for complete search history.

(56) References Cited

U.S. PATENT DOCUMENTS

| | | | |
|---|---|---|---|
| 7,993,999 B2 | 8/2011 | Basker et al. | |
| 8,048,723 B2 | 11/2011 | Chang et al. | |
| 8,053,299 B2 | 11/2011 | Xu | |
| 8,211,772 B2 | 7/2012 | Kavalieros et al. | |
| 8,581,320 B1 * | 11/2013 | Cheng | H01L 21/84 257/309 |
| 2005/0130358 A1 * | 6/2005 | Chidambarrao | H01L 21/823807 438/197 |
| 2005/0145954 A1 | 7/2005 | Zhu et al. | |
| 2005/0236668 A1 * | 10/2005 | Zhu | H01L 21/28035 257/347 |
| 2010/0044762 A1 | 2/2010 | Orlowski | |
| 2010/0144121 A1 * | 6/2010 | Chang | H01L 29/7851 438/478 |

(Continued)

OTHER PUBLICATIONS

Akarvardar et al., "Strained SiGe and Si FinFETs for High Performance Logic with SiGe/Si stack on SOI", 2010 IEEE, pp. 34.2.1-34.2.4.

(Continued)

*Primary Examiner* — Allen Parker
*Assistant Examiner* — Patricia Reddington
(74) *Attorney, Agent, or Firm* — Scully Scott Murphy and Presser; Frank Digiglio

(57) ABSTRACT

A method of manufacturing a semiconductor device, by etching a region of an SOI substrate so that only a portion of the original semiconductor is present above the insulator layer. After etching has occurred, a different semiconductor material is grown in the etched region, and fins are formed. An isolation layer is deposited to a height above that the base semiconductor of the etched region.

13 Claims, 4 Drawing Sheets

(56) References Cited

U.S. PATENT DOCUMENTS

| | | | |
|---|---|---|---|
| 2010/0308453 A1* | 12/2010 | Scheid | H01L 23/3675 257/698 |
| 2011/0108920 A1* | 5/2011 | Basker | H01L 21/845 257/351 |
| 2012/0025313 A1 | 2/2012 | Chang et al. | |
| 2012/0241818 A1 | 9/2012 | Kavalieros et al. | |
| 2015/0028454 A1* | 1/2015 | Cheng | H01L 29/785 257/616 |

OTHER PUBLICATIONS

Pending U.S. Appl. No. 13/792,291, filed Mar. 11, 2013, entitled: "Silicon-Germanium Fins and Silicon Fins on a Bulk Substrate".

* cited by examiner

FORMING FINS OF DIFFERENT SEMICONDUCTOR MATERIALS ON THE SAME SUBSTRATE

BACKGROUND

The present invention relates to semiconductor devices, and particularly to forming fins of two different semiconductor materials on the same substrate.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are often fabricated on the same substrate.

BRIEF SUMMARY

An embodiment of the invention may include a method of forming a semiconductor structure. The method involves removing a first region of a semiconductor-on-insulator (SOI) substrate, while maintaining a second region, so that a layer of the original semiconductor is a base in the first region. A second semiconductor is epitaxially grown in the first region on the original semiconductor base. Etching is performed to produce FinFET structures on the insulator layer. An STI layer is then deposited between the fins to a depth larger than the original semiconductor base.

An embodiment of the invention may include a method of forming a semiconductor structure. The method involves removing a pFET region of a semiconductor-on-insulator (SOI) substrate, while maintaining a nFET region, so that a layer of the original semiconductor is a base in the pFET region. A second semiconductor is epitaxially grown in the first region on the original semiconductor base. Etching is performed to produce FinFET structures on the insulator layer. An STI layer is then deposited between the fins to a depth larger than the original semiconductor base.

An embodiment of the invention may include a semiconductor structure. The structure may include a first fin made of a first semiconductor material. The structure may include a second fin, where the second fin has a fin base made of the first semiconductor material and a fin body made of a second semiconductor material. The structure also contains an isolating layer around the first and second fins, where the height of the isolating layer is larger than the fin base of the second fin.

BRIEF DESCRIPTION OF THE SEVERAL DRAWINGS

Figure 1:
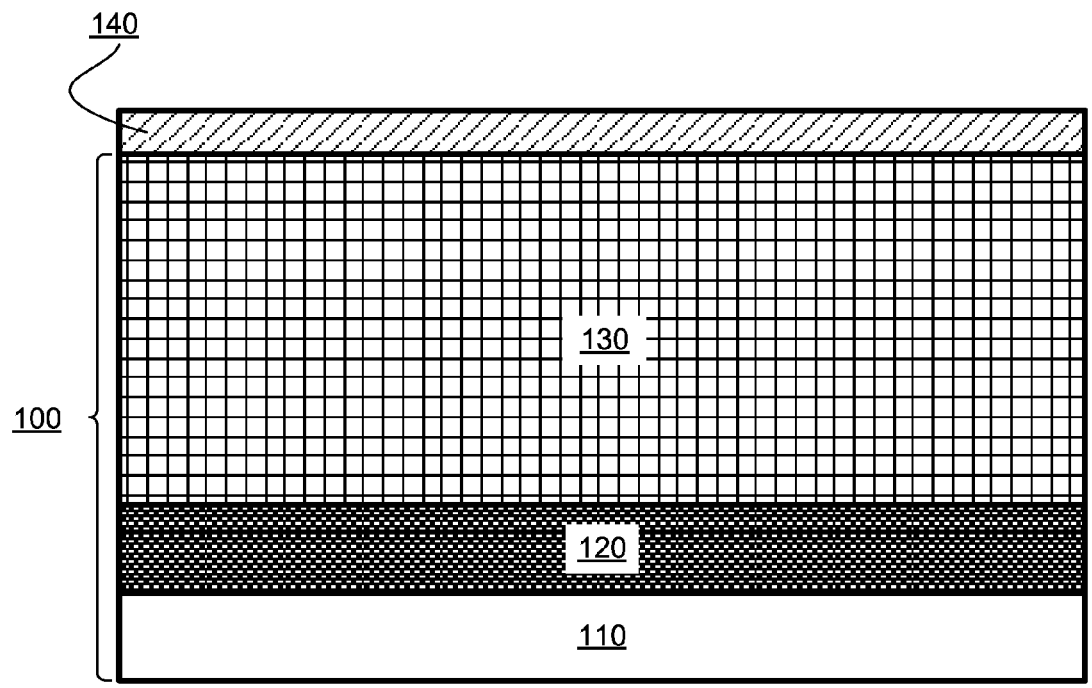
FIG. 1 is a cross-sectional view depicting depositing a masking layer on an SOI substrate, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Semiconductor devices may be built on a semiconductor on insulator (SOI) substrate in order to improve device performance, for example by reducing the power consumption needed to operate devices by lowering the parasitic capacitance. Additionally, fin field effect transistors (Fin-FETs) have recently been employed as a technique to scale down the size of semiconductors. As an additional way to increase performance, fins may use different semiconductor materials as a means to tune individual parameters of the device. For example, fins in an nFET region of a semiconductor device may be formed from different semiconductor materials as those in a pFET region, for example silicon and silicon germanium (SiGe), respectively. However, growing semiconductor fins directly on a Buried Oxide (BOX) layer of a SOI substrate may not be practical, and methods in which semiconductor fins are grown on a silicon base may suffer from parasitic capacitance issues. Exemplary embodiments may include forming semiconductor fins, having an SOI base, and with an insulating layer thicker than that of the SOI base. By maintaining an SOI base there may be a base crystal lattice for a semiconductor layer to grow on. Additionally, depositing an insulating layer thicker than that of the SOI base may create a fin composed of a semiconductor that does not suffer from capacitance loss because the silicon base layer is isolated. Further, the use of the insulating layer may result in a fin that acts as if it were composed entirely of the semiconductor material.

Referring to FIG. 1, a masking layer 140 may be deposited above an SOI layer 130 of an SOI substrate 100. The masking layer 140 may be deposited to protect the SOI layer 130 during subsequent processing steps, as well as prevent undesired growth of semiconductor material above the SOI layer 130 (described in more detail below in conjunction with FIG. 3). In an exemplary embodiment, the masking layer 140 may be made of oxides, nitrides, and oxynitrides of silicon, as well as oxides, nitrides, and oxynitrides of other elements, and may have a thickness of approximately 2 nm to approximately 10000 nm, preferably approximately 2 nm to approximately 200 nm.

The SOI substrate 100 may further include a buried insulator layer 120 below the SOI layer 130, and a base semiconductor layer 110 below the buried insulator layer 120. The buried insulator layer 120 may isolate the SOI layer 130 from the base semiconductor layer 110. The base semiconductor layer 110 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. Typically the base semiconductor layer 110 may be approximately, but is not limited to, several hundred microns thick. For example, the base semiconductor layer 110 may have a thickness ranging from approximately 0.5 mm to approximately 1.5 mm. The SOI substrate 100 may contain a second region 101 and a first region 102 which may be effectively undergo different processing steps in order to form fins having different properties.

The buried insulator layer 120 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 120 may include crystalline or non-crystalline dielectric material. The buried insulator layer 120 may be 40-500 nm thick.

The SOI layer 130 may be made of any of the several semiconductor materials possible for the base semiconductor layer 110. In general, the base semiconductor layer 110 and the SOI layer 130 may include either identical or different semiconducting materials with respect to chemical composition, dopant concentration and crystallographic orientation. In a preferred embodiment, the SOI layer 130 comprises silicon, silicon-germanium, or carbon-doped silicon. The SOI layer 130 may be doped with p-type dopants, such as boron, or doped with n-type dopants, such as phosphorus and/or arsenic. The dopant concentration may range from approximately $1\times10^{15}$ cm$^{-3}$ to approximately $1\times10^{19}$ cm$^{-3}$, preferably approximately $1\times10^{15}$ cm$^{-3}$ to approximately $1\times10^{16}$ cm$^{-3}$. In one embodiment, the SOI layer 130 is undoped. The SOI layer 130 may have a thickness ranging from approximately 5 nm to approximately 300 nm, preferably approximately 30 nm.

Figure 2:
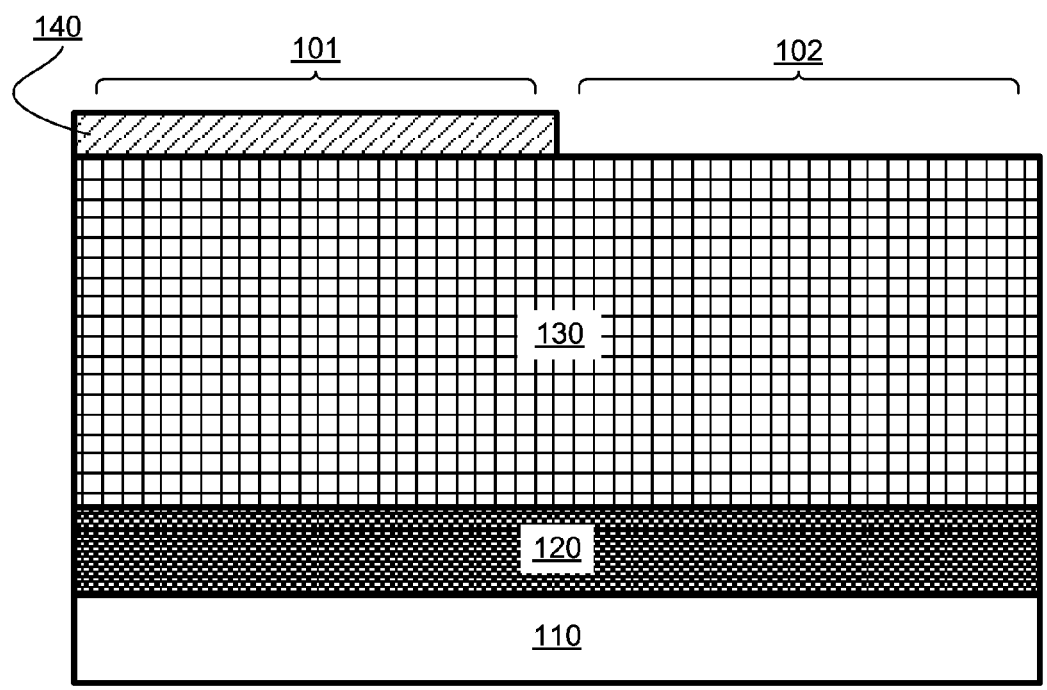
FIG. 2 is a cross-sectional view depicting removing the masking layer above a region of the semiconductor, according to an exemplary embodiment.

Referring to FIG. 2, the masking layer 140 may be etched to expose a first region 102 of the SOI layer 130 while a second region 101 remains covered by the masking layer 140. The masking layer 140 may be etched using lithographic patterning and etching techniques typically known in the art, such as reactive ion etching (RIE) and plasma etching.

Figure 3:
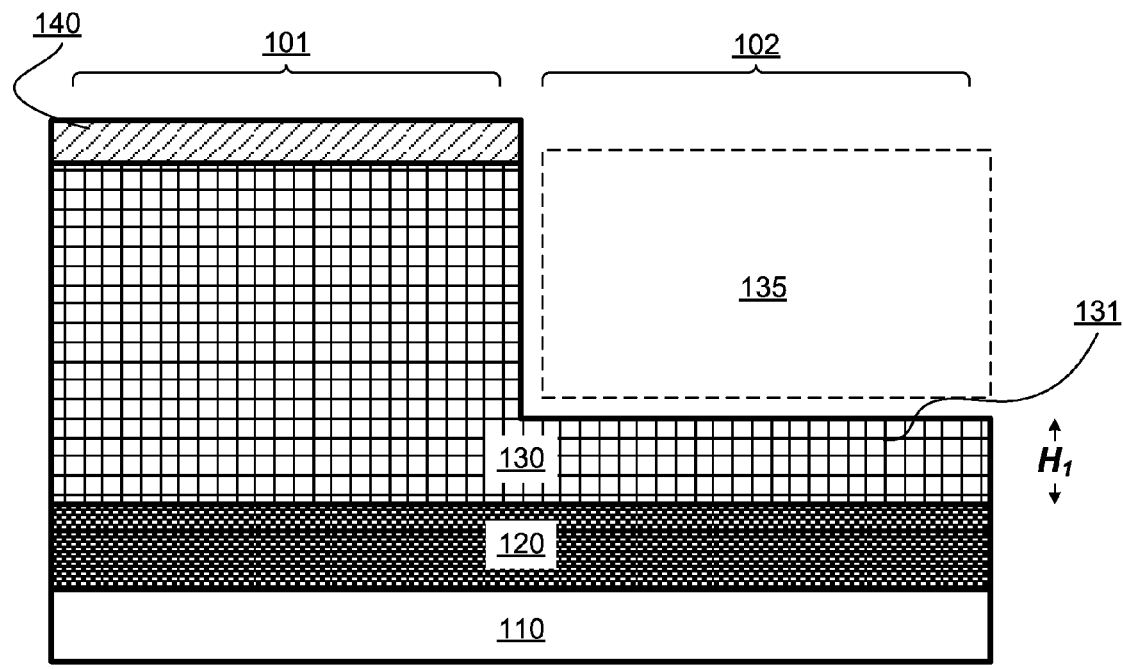
FIG. 3 is a cross-sectional view depicting removing the SOI layer in the region of the semiconductor, according to an exemplary embodiment.

Referring to FIG. 3, the SOI layer 130 may be etched in the first region 102 to form a recess 135, so that a base portion 131 of the SOI layer 130 remains between the recess 135 and the buried insulator layer 120. The recess 135 may be created using any suitable etching technique known in the art, including both wet and dry etching techniques, as well as isotropic and anisotropic etching techniques. The base portion 131 underlying recess 135 may have a thickness $H_1$ ranging from approximately 2 nm to approximately 50 nm.

Figure 4:
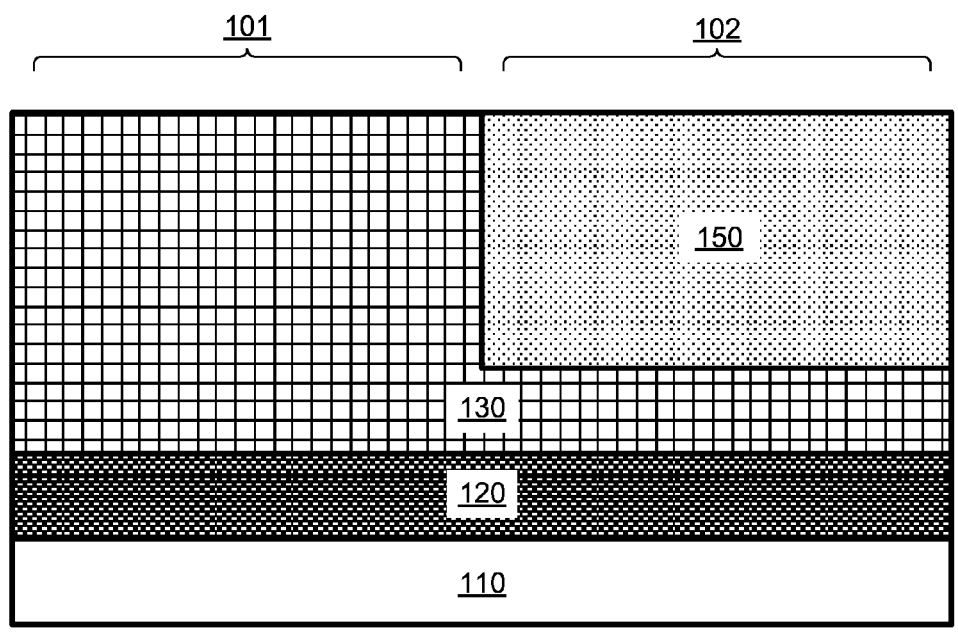
FIG. 4 is a cross-sectional view depicting depositing a semiconductor layer in the recessed region of the SOI layer and removing the masking layer, according to an exemplary embodiment.

Referring to FIG. 4, a semiconductor layer 150 may be formed in the recess 135 (FIG. 3). The semiconductor layer 150 may be made of a different semiconductor material than the SOI layer 130. In an exemplary embodiment, the SOI layer 130 may be made of silicon and the semiconductor layer 150 may be made of SiGe. In an exemplary embodiment, the semiconductor layer 150 and the base portion 131 may have approximately the same combined thickness as the thickness of the SOI layer 130 in the second region 101. However, in alternative embodiments, the semiconductor layer 150 and the base portion 131 may have a thickness greater than or less than the thickness of the SOI layer 130, in order to create fins of different heights in the first region 102 and the second region 101. Deposition of semiconductor layer 150 may be performed by epitaxially growing the semiconductor material in the recess 135 on the base SOI layer 131. The base SOI layer 131 provides a crystal lattice structure which enables the semiconductor layer 150 to grow on the surface of the base portion 131 with the same crystal lattice structure as the SOI layer 130.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Referring to FIG. 4, the masking layer 140 may be removed from above the SOI layer 130 in the second region 101. Removing the sacrificial oxide may be performed by using any suitable etching technique known in the art, including both wet and dry etching techniques, as well as isotropic and anisotropic etching techniques.

Figure 5:
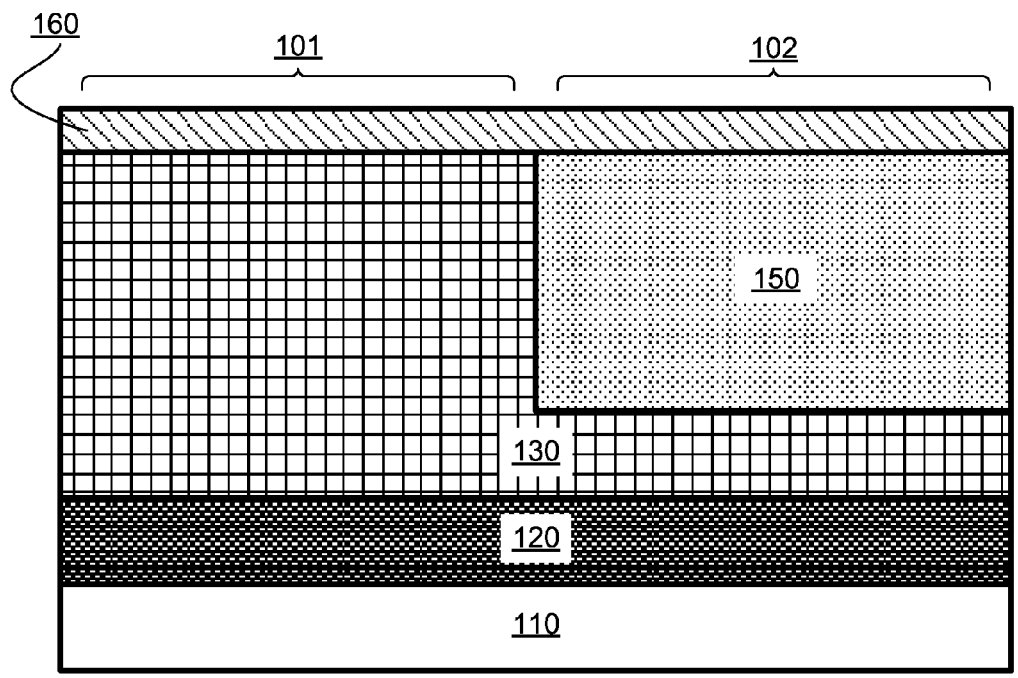
FIG. 5 is a cross-sectional view depicting depositing a capping layer above the SOI layer and the semiconductor layer, according to an exemplary embodiment.

Referring to FIG. 5, a capping layer 160 may be deposited above the SOI layer 130 and semiconductor layer 150. The capping layer 160 is intended to protect the SOI layer 130 and semiconductor layer 150 during fin formation and subsequent processing. The capping layer 160 may be made from any of several known nitrides or oxides such as, for example, silicon nitride. In such embodiments, the capping layer 160 may have any thickness capable of protecting the underlying fins, for example thickness ranging from, but not limited to, approximately 200 nm to approximately 400 nm. Deposition of the capping layer 160 may be performed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Figure 6:
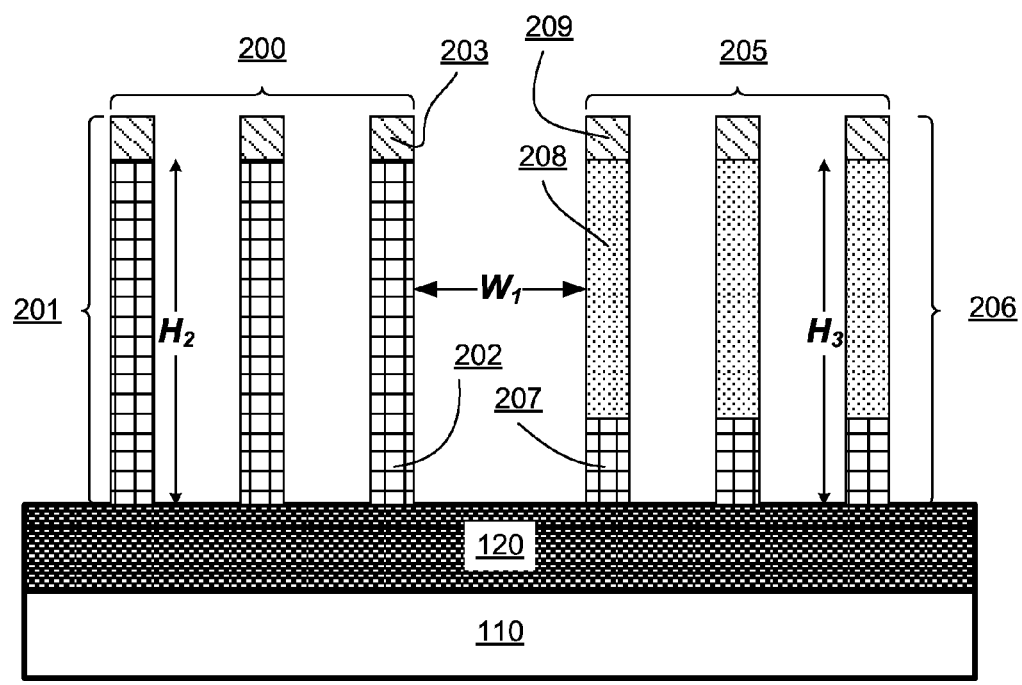
FIG. 6 is a cross-sectional view depicting patterning the SOI layer and the semiconductor layer and forming fins, according to an exemplary embodiment.

Referring to FIG. 6, first fins 205 and second fins 200 may be formed from the SOI layer 130 in the second region 101 and the semiconductor layer 150 in the first region 102, respectively. The first fins and the second fins may be formed, for example by removing material from the SOI layer 130 and the semiconductor layer 150 using a photolithography process followed by an anisotropic etching process such as reactive ion etching (RIE) or plasma etching. Other methods of forming fins known in the art may also be utilized, such as sidewall image transfer (SIT).

The first fins 205 include at least one first fin 206 including a first fin base 207 made of the material of the SOI layer 130, a first fin body 208 made of the material of the semiconductor layer 150 directly on the first fin base 207, and a first capping layer 209 above the first fin body 208. The first fin 206 may have an intermediate fin height of $H_3$, as measured from the buried insulator layer 120 to the top of the first fin body 208. The second fins 200 include at least one second fin 201 including a second fin body 202 made of the material of the SOI layer 130 directly on the buried insulator layer 120, and a second capping layer 203 above the second fin body 202. The second fin 201 may have an intermediate fin height of $H_2$, as measured from the buried insulator layer 120 to the top of the second fin body 202. In some embodiments, epitaxial growth of the semiconductor layer 150 may be halted prior before it reaches the height of SOI layer 130, and may result in the second fin 201 may have an intermediate fin height of $H_2$ being greater than the first fin 206 may have an intermediate fin height of $H_3$. The first and second fins may be patterned using any suitable fin pattern known in the art. The first fins 205 may be spaced apart from the second fins 200 by a distance $W_1$. To ensure that the material deposited for the first fins 205 does not contaminate the second fins 200, distance $W_1$ may be, but is not limited to, at least approximately 5 nm.

Figure 7:
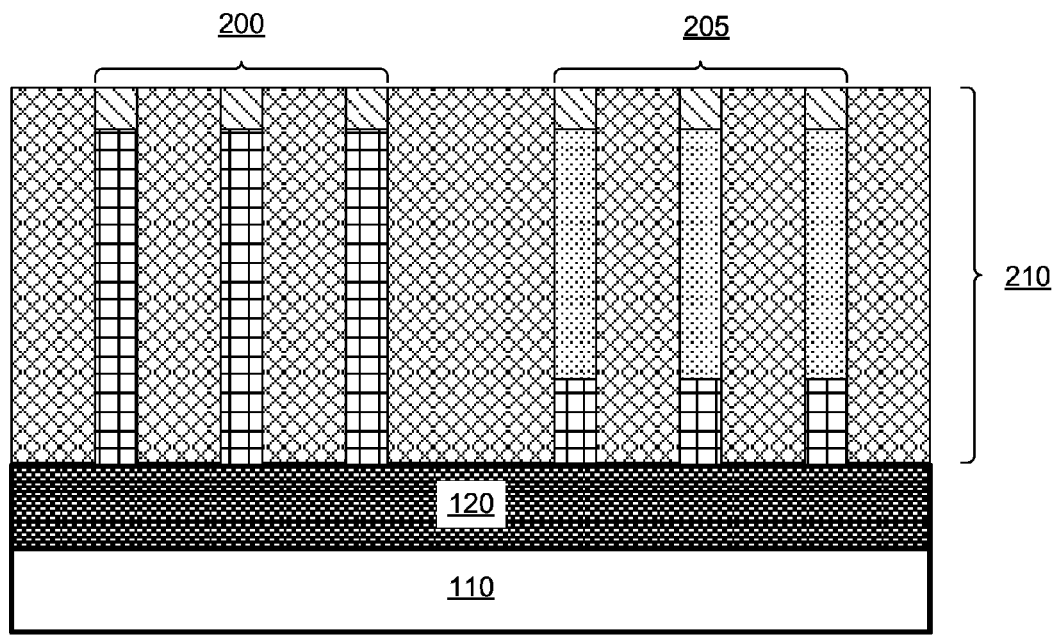
FIG. 7 is a cross-sectional view depicting depositing an insulator layer between the formed fins, according to an exemplary embodiment.

Referring to FIG. 7, an insulating layer 210 may be deposited above the buried insulator layer 120, surrounding at least bottom portions of the first fins 205 and the second fins 200. The insulating layer may fully surround the second fins 200 and the first fins 205, as depicted in FIG. 7. In such embodiments, the insulating layer 210 may be any suitable oxide, nitride or oxynitride, such as, for example, silicon oxide, silicon nitride or silicon oxynitride. Deposition of the insulating layer 210 may be performed by any suitable method known in the art such as, for example, CVD, or spin-on deposition. Following deposition of the insulating layer 210, the insulating layer 210 may be planarized using, for example, chemical mechanical planarization (CMP), to expose the first capping layers 209 (FIG. 7) and the second capping layers 203 (FIG. 7).

Figure 8:
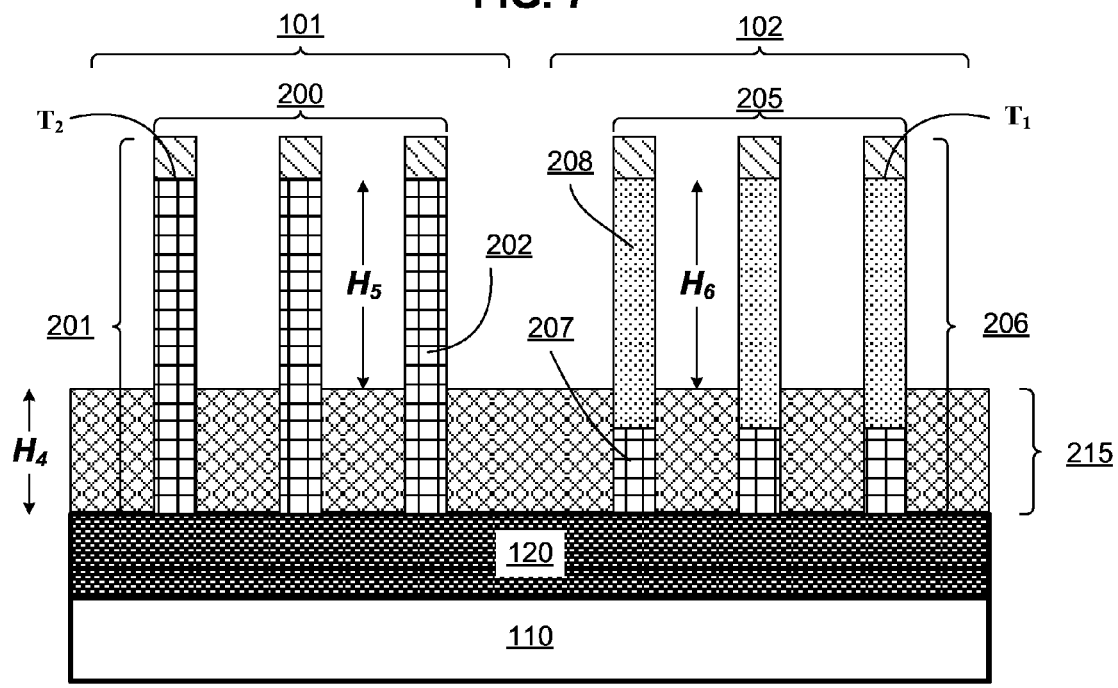
FIG. 8 is a cross-sectional view depicting recessing the insulator layer to form a recessed STI layer, according to an exemplary embodiment.

Referring to FIG. 8, the insulating layer 210 (FIG. 7) may be recessed below the height of the first fins 205 and second fins 200 to form an isolating layer 215. The insulating layer 210 may be recessed using any suitable etching technique known in the art, including both wet and dry etching techniques, as well as isotropic and anisotropic etching techniques. In a preferred embodiment, reactive ion etching may be performed.

Still referring to FIG. 8, following recessing, the isolating layer 215 may have a thickness $H_4$ greater than the thickness $H_1$ (FIG. 3) of the first fin base 207. The isolating layer 215, being thicker than the first fin base 207, may create a first fin 206, whereby the effective fin material may act the same as the material used in the semiconductor layer 150 (FIG. 5), and the resultant effective height $H_6$ of the first fin 206 is the difference in height between the top surface of the isolating layer 215 and top $T_1$ of the first semiconductor fin body 208. In an exemplary embodiment, the first fin 206 may create a fin that acts as if it were a fin made of the semiconductor material of the semiconductor layer 150 with a fin height the same as the effective height $H_6$. In the aforementioned exemplary embodiment, the semiconductor material surrounded by the insulating layer 215 does not contribute to the properties of the first fin 206. In an exemplary embodiment, first fin 206 may have a height $H_6$ ranging from, but not limited to, approximately 5 nm to approximately 100 nm. Additionally, an effective height $H_5$ of the second fin 201 is the difference in height between the isolating layer 215 and top $T_2$ of the second SOI fin body 202. In an exemplary embodiment, second fin 201 may have a height $H_5$ ranging from, but not limited to, approximately 5 nm to approximately 100 nm.

The isolating layer 215 may isolate the fins to reduce parasitic capacitance loss. Additionally, the isolating layer 215 may define a pathway for current to travel along the length of the fin, where predominant pathway of the current is in the material located above the isolating layer 215. This may create a semiconductor in which the first fins 205 exhibit properties of a fin made entirely out of the semiconductor layer 150 (FIG. 5) material having the effective fin height $H_6$, while the second fins 200 maintain the properties of the SOI layer 130 (FIG. 5) material having the effective fin height $H_5$. In an exemplary embodiment, this may create a semiconductor structure that mimics a device that has a first set of fins located on an insulator, made entirely of the material of the semiconductor layer 150, where the first fins have a height of $H_6$, on the same device as a second set of fins located on an insulator, made entirely of the material of the SOI layer 130, where the second fins have a height of $H_5$.

Still referring to FIG. 8, in additional embodiments masking may be performed prior to recessing insulating layer 210 (FIG. 7), so that the insulating layer 210 may be etched independently in the second region 101 and the first region 102. By creating different heights of the isolating layer 215, this may allow tuning of device parameters by creating fins with multiple effective heights. In such embodiments, the isolating layer 215 would consist of varying heights, i.e. the isolating layer 215 thickness $H_4$ may vary between the second region 101 and the first region 102, or between fins in the second region 101 or the first region 102. For example, by masking portions of first region 102, the first fin 206 height $H_6$ may vary amongst the first fins 205. For example, by masking portions of second region 101, the second fin 201 height $H_5$ may vary amongst the first fins 200. Additionally, masking the first region 102 while leaving the second region 101 unmasked may result in the first height $H_6$ being larger than the second height $H_5$. Conversely, masking the second region 101 while leaving the first region 102 unmasked may result in the second height $H_5$ being larger than the first height $H_6$. Manipulation of the effective heights of the fin structure may result in FinFETs having different operational parameters, and allows tuning of the structures to increase device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    removing a portion of a semiconductor-on-insulator (SOI) layer comprising a first semiconductor material from a first region of the SOI layer, such that a base portion of the SOI layer remains in the first region, the base portion having a thickness less than the SOI layer in a second region, wherein the SOI layer is located above an insulating layer;
    forming a semiconductor layer comprising a second semiconductor material above the base portion in the first region, the second semiconductor material being different from the first semiconductor material;
    etching the semiconductor layer and the base portion in the first region to form a first fin, wherein the first fin has a height defined by the distance between the insulating layer and the top of the semiconductor layer;
    etching the SOI layer in the second region to form a second fin comprising the first semiconductor material, wherein the second fin has a height defined by the distance between the insulating layer and the top of the SOI layer; and
    forming an isolating layer around the first fin and the second fin, the isolating layer having a thickness greater than the thickness of the base portion in the first region but less than the height of the first fin and the height of the second fin.

2. The method of claim 1, wherein forming the semiconductor layer comprises forming the semiconductor layer so that a top surface of the semiconductor layer is below a top surface of the SOI layer.

3. The method of claim 1, wherein etching the semiconductor layer and the base portion in the first region to form a first fin comprises removing material above the insulating layer and adjacent to the first fin.

4. The method of claim 1, further comprising recessing at least one region of the isolating layer.

5. The method of claim 1, wherein the first semiconductor material is silicon.

6. The method of claim 1, wherein the second semiconductor material is silicon germanium.

7. The method of claim 1, wherein the first region is a pFET region and the second region is an nFET region.

8. The method of claim 1, wherein forming the semiconductor layer comprises epitaxially growing the second semiconductor material of the semiconductor layer on the first semiconductor material of the SOI layer in the first region.

9. A method of forming a semiconductor structure, the method comprising:
    removing a portion of a semiconductor-on-insulator (SOI) layer comprising a first semiconductor material from a pFET region of the SOI layer, such that a base portion of the SOI layer remains in the pFET region, the base portion having a thickness less than the SOI layer in a nFET region, wherein the first semiconductor material is silicon;
    forming a semiconductor layer comprising a second semiconductor material above the base portion in the PFET region, wherein the second semiconductor material is silicon germanium;
    etching the semiconductor layer and the base portion in the pFET region to form a pFET fin, wherein the PFET fin has a height defined by the distance between the insulating layer and the top of the semiconductor layer;
    etching the SOI layer in the nFET region to form a nFET fin comprising the first semiconductor material, wherein the nFET fin has a height defined by the distance between the insulating layer and the top of the SOI layer; and
    forming an isolating layer around the pFET fin and the nFET fin, the isolating layer having a thickness greater than the thickness of the base portion in the PFET region but less than a height of the pFET fin and a height of the nFET fin.

10. The method of claim 9, wherein forming the semiconductor layer comprises forming the semiconductor layer so that a top surface of the semiconductor layer is below a top surface of the SOI layer.

11. The method of claim 9, wherein etching the semiconductor layer and the base portion in the pFET region to form a pFET fin comprises removing material above the insulating layer and adjacent to the pFET fin.

12. The method of claim 9, further comprising recessing at least one region of the isolating layer.

13. The method of claim 9, wherein forming the semiconductor layer comprises epitaxially growing the second semiconductor material of the semiconductor layer on the first semiconductor material of the SOI layer in the pFET region.

* * * * *